(12) United States Patent
Kim et al.

(10) Patent No.: US 10,469,074 B2
(45) Date of Patent: Nov. 5, 2019

(54) POWER ON/OFF RESET CIRCUIT AND RESET SIGNAL GENERATING CIRCUIT INCLUDING THE SAME

(71) Applicant: SAMSUNG ELECTRONICS CO., LTD., Suwon-si, Gyeonggi-do (KR)

(72) Inventors: Jin-Woo Kim, Changwon-si (KR); Yong-Joo Song, Hwaseong-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/871,558

(22) Filed: Jan. 15, 2018

(65) Prior Publication Data

US 2018/0337672 A1  Nov. 22, 2018

(30) Foreign Application Priority Data

May 19, 2017  (KR) .......................... 10-2017-0062543

(51) Int. Cl.
| | |
|---|---|
| *H03K 17/22* | (2006.01) |
| *G06F 1/26* | (2006.01) |
| *G06F 1/24* | (2006.01) |
| *G01R 19/165* | (2006.01) |

(52) U.S. Cl.
CPC ............ *H03K 17/223* (2013.01); *G06F 1/24* (2013.01); *G06F 1/26* (2013.01); *G01R 19/16552* (2013.01)

(58) Field of Classification Search
None
See application file for complete search history.

(56) References Cited

U.S. PATENT DOCUMENTS

| | | | |
|---|---|---|---|
| 5,534,804 A | * | 7/1996 | Woo ..................... H03K 17/223 327/143 |
| 5,778,238 A | | 7/1998 | Hofhine |
| 6,600,350 B2 | | 7/2003 | Sekimoto et al. |
| 6,744,291 B2 | | 6/2004 | Payne et al. |
| 2008/0157832 A1 | | 7/2008 | Park et al. |

(Continued)

FOREIGN PATENT DOCUMENTS

| | | |
|---|---|---|
| JP | 2003-110414 | 4/2003 |
| JP | 2010-141552 | 6/2010 |

(Continued)

*Primary Examiner* — Long Nguyen
(74) *Attorney, Agent, or Firm* — F. Chau & Associates, LLC

(57) ABSTRACT

A power on/off reset circuit includes a driving circuit, a hysteresis control circuit and a buffering circuit. The driving circuit detects a first level of a power supply voltage during a power-on duration of the power supply voltage, detects a second level of the power supply voltage during a power-off duration of the power supply voltage, and generates a driving signal that is transitioned based on the first level and the second level. The hysteresis control circuit is connected to an output terminal of the driving circuit, is activated or deactivated based on the power supply voltage without a control signal, is activated during one of the power-on duration and the power-off duration, and is deactivated during the other of the power-on duration and the power-off duration. The buffering circuit is connected to the output terminal of the driving circuit, and generates a reset signal based on the driving signal.

12 Claims, 12 Drawing Sheets

(56) References Cited

U.S. PATENT DOCUMENTS

2008/0309384 A1\* 12/2008 Guimont .............. H03K 17/223
327/143
2016/0134274 A1    5/2016 Takemura

FOREIGN PATENT DOCUMENTS

| KR | 10-2000-0015676 | 3/2000  |
|----|-----------------|---------|
| KR | 10-0313512      | 10/2001 |
| KR | 10-2002-0009702 | 2/2002  |
| KR | 10-0476875      | 7/2005  |
| KR | 10-0901972      | 6/2009  |
| KR | 101226030       | 1/2013  |

\* cited by examiner

US 10,469,074 B2

POWER ON/OFF RESET CIRCUIT AND RESET SIGNAL GENERATING CIRCUIT INCLUDING THE SAME

CROSS-REFERENCE TO RELATED APPLICATION

This application claims priority under 35 USC § 119 to Korean Patent Application No. 10-2017-0062543, filed on May 19, 2017 in the Korean Intellectual Property Office (KIPO), the disclosure of which is incorporated by reference herein in its entirety.

TECHNICAL FIELD

Example embodiments relate generally to semiconductor integrated circuits, and more particularly to power on/off reset circuits and reset signal generating circuits including the power on/off reset circuits.

DISCUSSION OF THE RELATED ART

Semiconductor integrated circuits operate based on at least one power supply voltages (or power sources) provided from an external circuit. To prevent malfunction or abnormal operation of the semiconductor integrated circuit during a time interval in which each power supply voltage is turned on or off, a circuit for resetting the semiconductor integrated circuit (e.g., internal logics and/or channel outputs of the semiconductor integrated circuit) may be required. Such circuit for resetting the semiconductor integrated circuit during a power-on mode and/or a power-off mode may be referred to as a power on/off reset (POR) circuit.

SUMMARY

An example embodiment of the present inventive concept provides a power on/off reset circuit capable of detecting different levels of a power supply voltage in a power-on mode and a power-off mode, and capable of having a relatively simple structure.

An example embodiment of the present inventive concept provides a reset signal generating circuit including the power on/off reset circuit.

According to an example embodiment, a power on/off reset circuit includes a driving circuit, a hysteresis control circuit and a buffering circuit. The driving circuit detects a first level of a power supply voltage during a power-on duration of the power supply voltage, detects a second level of the power supply voltage during a power-off duration of the power supply voltage, and generates a driving signal that is transitioned based on the first level and the second level. The hysteresis control circuit is connected to an output terminal of the driving circuit, is activated or deactivated based on the power supply voltage without a control signal provided from an external circuit, is activated during one of the power-on duration and the power-off duration, and is deactivated during the other of the power-on duration and the power-off duration. The second level is different from the first level based on the activation and the deactivation of the hysteresis control circuit. The buffering circuit is connected to the output terminal of the driving circuit, and generates a reset signal based on the driving signal. The reset signal is activated during the power-on duration and the power-off duration.

According to an example embodiment, a reset signal generating circuit includes a first power on/off reset circuit, a second power on/off reset circuit and a logic circuit. The first power on/off reset circuit generates a first reset signal that is activated during a first power-on duration of a first power supply voltage and a first power-off duration of the first power supply voltage. The second power on/off reset circuit generates a second reset signal that is activated during a second power-on duration of a second power supply voltage and a second power-off duration of the second power supply voltage. The logic circuit generates a combined reset signal based on the first reset signal and the second reset signal. The first power on/off reset circuit includes a first driving circuit, a first hysteresis control circuit and a first buffering circuit. The first driving circuit detects a first level of the first power supply voltage during the first power-on duration, detects a second level of the first power supply voltage during the first power-off duration, and generates a first driving signal that is transitioned based on the first level and the second level. The first hysteresis control circuit is connected to an output terminal of the first driving circuit, is activated or deactivated based on the first power supply voltage without a control signal provided from an external circuit, is activated during one of the first power-on duration and the first power-off duration, and is deactivated during the other of the first power-on duration and the first power-off duration. The second level is different from the first level based on the activation and the deactivation of the first hysteresis control circuit. The first buffering circuit is connected to the output terminal of the first driving circuit, and generates the first reset signal based on the first driving signal.

The power on/off reset circuit according to an example embodiment may include the hysteresis control circuit. The hysteresis control circuit may have the hysteresis characteristic, and the first level of the power supply voltage detected during the power-on duration may be different from the second level of the power supply voltage detected during the power-off duration, based on the hysteresis characteristic. In addition, the hysteresis control circuit may be activated or deactivated based on only the power supply voltage without the control signal provided from the external circuit. Accordingly, the power on/off reset circuit may have relatively simple structure and enhanced performance.

BRIEF DESCRIPTION OF THE DRAWINGS

Illustrative and non-limiting example embodiments will be more clearly understood from the following detailed description taken in conjunction with the accompanying drawings.

DETAILED DESCRIPTION OF THE EMBODIMENTS

Figure 1:
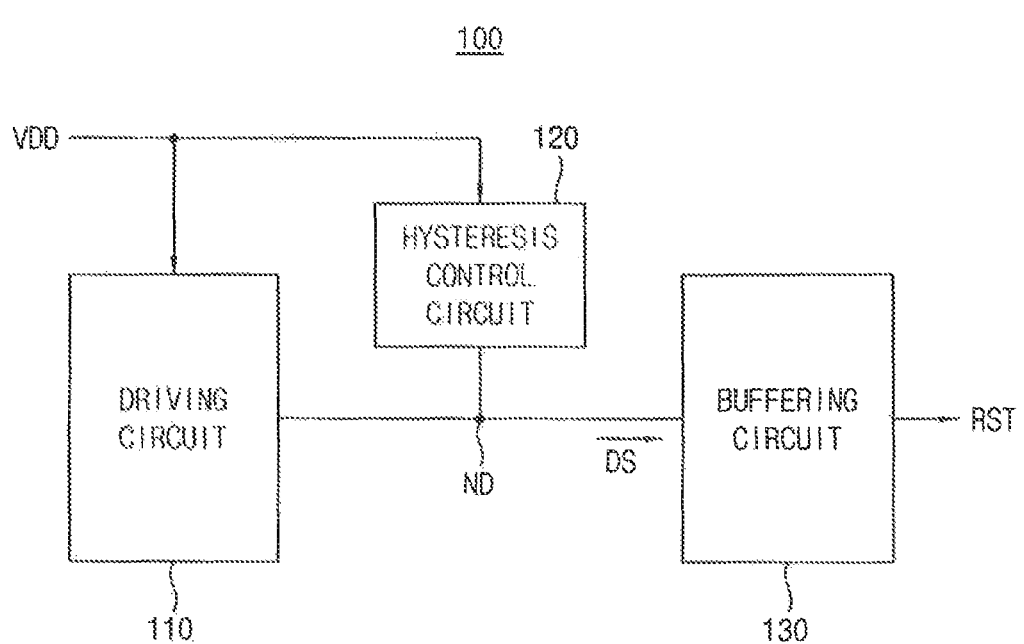
FIG. 1 is a block diagram illustrating a power on/off reset circuit according to an example embodiment.

Example embodiments will be described more fully with reference to the accompanying drawings, in which example embodiments are shown. The present inventive concept may, however, be embodied in many different forms and should not be construed as limited to the example embodiments set forth herein. Like reference numerals refer to like elements throughout this application.

FIG. 1 is a block diagram illustrating a power on/off reset circuit according to an example embodiment.

Referring to FIG. 1, a power on/off reset (POR) circuit 100 includes a driving circuit 110, a hysteresis control circuit 120 and a buffering circuit 130.

The driving circuit 110 detects a power supply voltage VDD. For example, the driving circuit 110 detects a first level of the power supply voltage VDD during a power-on duration (e.g., in a power-on mode) of the power supply voltage VDD, and detects a second level of the power supply voltage VDD during a power-off duration (e.g., in a power-off mode) of the power supply voltage VDD. The second level is different from the first level. For example, the driving circuit 110 may detect different levels of the power supply voltage VDD during the power-on duration and the power-off duration of the power supply voltage VDD.

The power-on duration of the power supply voltage VDD may indicate a time interval during which the power supply voltage VDD is transitioned from a deactivation level to an activation level. The power-off duration of the power supply voltage VDD may indicate a time interval during which the power supply voltage VDD is transitioned from the activation level to the deactivation level. For example, the power supply voltage VDD may be transitioned from a low level (e.g., about 0V) to a high level during the power-on duration, and may be transitioned from the high level to the low level during the power-off duration.

The driving circuit 110 generates a driving signal DS based on the first level and the second level. For example, the driving signal DS is transitioned based on the first level and the second level.

The hysteresis control circuit 120 is connected to an output terminal of the driving circuit 110. The hysteresis control circuit 120 is activated or deactivated based on the power supply voltage VDD without a control signal provided from an external circuit. For example, the hysteresis control circuit 120 is activated during one of the power-on duration and the power-off duration, and is deactivated during the other of the power-on duration and the power-off duration such that the second level is different from the first level based on the activation and the deactivation of the hysteresis control circuit 120. For example, the hysteresis control circuit 120 may have hysteresis characteristic, and the second level may be different from the first level based on the hysteresis characteristic.

The buffering circuit 130 is connected to the output terminal of the driving circuit 110. The buffering circuit 130 generates a reset signal RST based on the driving signal DS. For example, the reset signal RST is activated during the power-on duration and the power-off duration. As will be described with reference to FIG. 13, a semiconductor integrated circuit including the power on/off reset circuit 100 may be reset or initialized based on the reset signal RST.

The power on/off reset circuit 100 according to an example embodiment may include the hysteresis control circuit 120. The hysteresis control circuit 120 may have the hysteresis characteristic, and the first level of the power supply voltage VDD detected during the power-on duration may be different from the second level of the power supply voltage VDD detected during the power-off duration, based on the hysteresis characteristic. In addition, the hysteresis control circuit 120 may be activated or deactivated based on only the power supply voltage VDD without the control signal provided from the external circuit. Accordingly, the power on/off reset circuit 100 may have relatively simple structure and increased performance.

Figure 2:
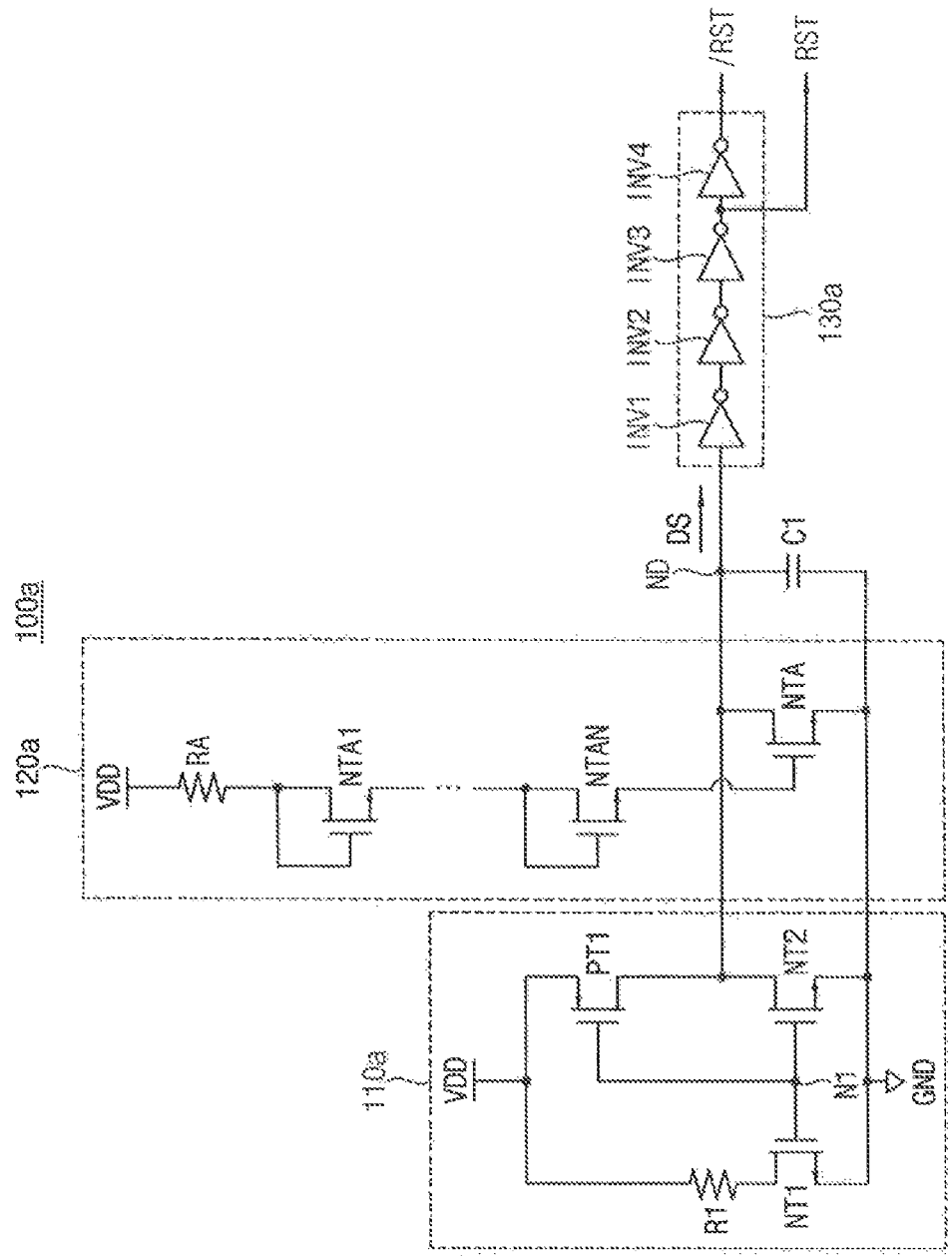
FIG. 2 is a circuit diagram illustrating an example of the power on/off reset circuit of FIG. 1.

FIG. 2 is a circuit diagram illustrating an example of the power on/off reset circuit of FIG. 1.

Referring to FIG. 2, a power on/off reset circuit 100a includes a driving circuit 110a, a hysteresis control circuit 120a and a buffering circuit 130a. The power on/off reset circuit 100a may further include a capacitor C1.

The driving circuit 110a may include a first resistor R1, a first n-type metal oxide semiconductor (NMOS) transistor NT1, a first p-type metal oxide semiconductor (PMOS) transistor PT1 and a second NMOS transistor NT2.

The first resistor R1 may be connected to the power supply voltage VDD, and the first NMOS transistor NT1 may be connected between the first resistor R1 and a ground voltage GND. For example, the first resistor R1 may include a first end connected to a power terminal to which the power supply voltage VDD is provided, and a second end connected to a first electrode (e.g., a drain electrode) of the first NMOS transistor NT1. The first NMOS transistor NT1 may include the first electrode connected to the second end of the first resistor R1, a second electrode (e.g., a source electrode) connected to a ground terminal to which the ground voltage GND is provided, and a gate electrode connected to a first node N1. In other words, the first resistor R1 and the first NMOS transistor NT1 may be connected in series between the power terminal and the ground terminal.

The first PMOS transistor PT1 may be connected to the power supply voltage VDD, and the second NMOS transistor NT2 may be connected between the first PMOS transistor PT1 and the ground voltage GND. For example, the first PMOS transistor PT1 may include a first electrode (e.g., a source electrode) connected to the power terminal, a second electrode (e.g., a drain electrode) connected to an output terminal (or an output node) ND of the driving circuit 110a, and a gate electrode connected to the first node N1. The second NMOS transistor NT2 may include a first electrode connected to the output terminal ND of the driving circuit 110a, a second electrode connected to the ground terminal, and a gate electrode connected to the first node N1. In other words, the first PMOS transistor PT1 and the second NMOS transistor NT2 may be connected in series between the power terminal and the ground terminal. A set of the first PMOS transistor PT1 and the second NMOS transistor NT2 and a set of the first resistor R1 and the first NMOS transistor NT1 may be connected in parallel between the power terminal and the ground terminal. The gate electrode of the first NMOS transistor NT1, the gate electrode of the first PMOS transistor PT1 and the gate electrode of the second NMOS transistor NT2 may be commonly connected to the first node N1.

The first resistor R1 and the first NMOS transistor NT1 may operate as a sensing circuit that detects a level of the power supply voltage VDD. For example, the first resistor R1 and the first NMOS transistor NT1 may operate as a voltage divider that divides the power supply voltage VDD based on a resistance ratio (or an impedance ratio) of the first resistor R1 to the first NMOS transistor NT1. The first PMOS transistor PT1 and the second NMOS transistor NT2 may operate as a driving inverter that selectively turns on based on the level of the power supply voltage VDD to generate the driving signal DS.

The hysteresis control circuit 120a may include a hysteresis control transistor NTA and a plurality of first control transistors NTA1, . . . , NTAN. The hysteresis control circuit 120a may further include a resistor RA.

The hysteresis control transistor NTA may be connected between the output terminal ND of the driving circuit 110a and the ground voltage GND (e.g., the ground terminal). The plurality of first control transistors NTA1~NTAN may be connected in series between the power supply voltage VDD (e.g., the power terminal) and a gate electrode of the hysteresis control transistor NTA. Each of the plurality of first control transistors NTA1~NTAN may include a gate electrode and a drain electrode that are directly connected to each other. For example, each of the plurality of first control transistors NTA1~NTAN may have a diode-connection configuration, and may operate as a diode. The resistor RA may be connected between the power supply voltage VDD and the first control transistor NTA1.

In an example of FIG. 2, the hysteresis control transistor NTA may be an NMOS transistor. For example, the hysteresis control transistor NTA may include a first electrode (e.g., a drain electrode) connected to the output terminal ND of the driving circuit 110a, a second electrode (e.g., a source electrode) connected to the ground terminal, and the gate electrode. The hysteresis control transistor NTA and the second NMOS transistor NT2 may be connected in parallel between the output terminal ND of the driving circuit 110a and the ground terminal. The hysteresis control transistor NTA may help or assist an operation of the second NMOS transistor NT2. For example, the hysteresis control transistor NTA may operate as an auxiliary transistor for the second NMOS transistor NT2.

In addition, in an example of FIG. 2, each of the plurality of first control transistors NTA1~NTAN may be an NMOS transistor. When the level of the power supply voltage VDD may be higher than a sum of threshold voltages of the plurality of first control transistors NTA1~NTAN, a voltage level at the gate electrode of the hysteresis control transistor NTA may increase, and thus the hysteresis control transistor NTA may be turned on.

In an example embodiment, if the hysteresis control transistor NTA is an NMOS transistor, the first level of the power supply voltage VDD detected during the power-on duration may be lower than the second level of the power supply voltage VDD detected during the power-off duration, as will be described with reference to FIG. 3.

The buffering circuit 130a may include a plurality of inverters INV1, INV2, INV3 and INV4 that are connected in series. The plurality of inverters INV1~INV4 may generate the reset signal RST and an inverted reset signal /RST (or an inversion signal of the reset signal RST) by buffering the driving signal DS. For example, the inverted reset signal /RST may have a waveform similar to that of the driving signal DS, and the reset signal RST may have a waveform similar to that of an inversion signal of the driving signal DS.

The capacitor C1 may be connected between the output terminal ND of the driving circuit 110a and the ground voltage GND (e.g., the ground terminal).

In addition, the number of the plurality of first control transistors NTA1~NTAN in the hysteresis control circuit 120a and/or the number of the plurality of inverters INV1~INV4 in the buffering circuit 130a may be changed.

Figure 3:
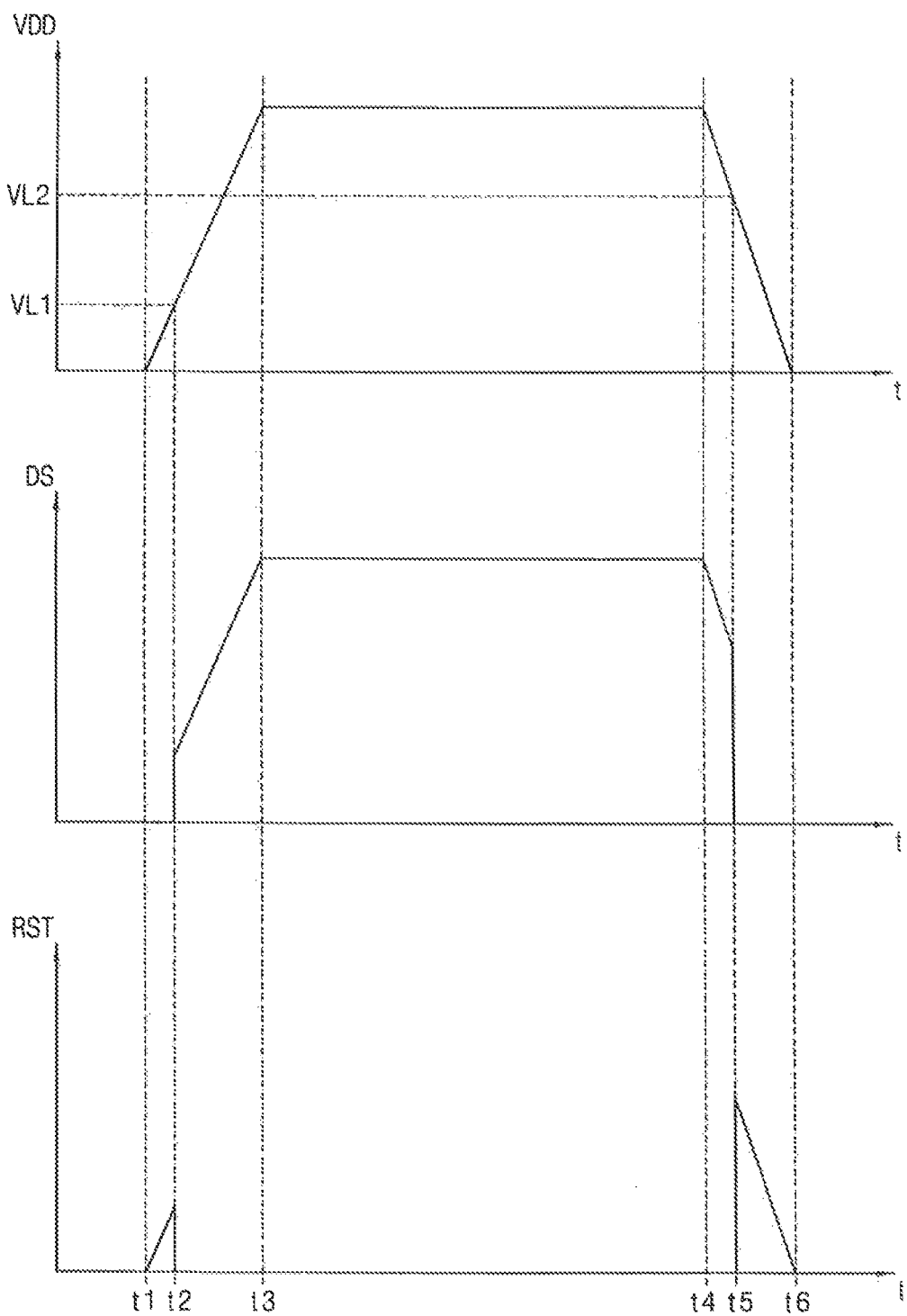
FIG. 3 is a diagram describing an operation of the power on/off reset circuit of FIG. 2.

FIG. 3 is a diagram describing an operation of the power on/off reset circuit of FIG. 2.

Referring to FIGS. 2 and 3, before time t1, the power supply voltage VDD is maintained to a deactivation level. From time t1 to time t3, the power supply voltage VDD is transitioned from the deactivation level to an activation level. From time t3 to time t4, the power supply voltage VDD is maintained to the activation level. From time t4 to time t6, the power supply voltage VDD is transitioned from the activation level to the deactivation level. After time t6, the power supply voltage VDD is maintained to the deactivation level. In an example of FIG. 3, a time interval from time t1 to time t3 may correspond to the power-on duration of the power supply voltage VDD, and a time interval from time t4 to time t6 may correspond to the power-off duration of the power supply voltage VDD.

At time t1 which corresponds to a starting point of the power-on duration, the level of the power supply voltage VDD is lower than the sum of the threshold voltages of the plurality of first control transistors NTA1~NTAN. Thus, during the power-on duration, the hysteresis control transistor NTA is turned off, and the driving signal DS is generated based on the first PMOS transistor PT1 and the second NMOS transistor NT2. During the power-on duration, the driving signal DS is generated by detecting a first level VL1 of the power supply voltage VDD, and then the driving signal DS is transitioned at time t2 at which the power supply voltage VDD has or reaches the first level VL1. For example, from time t1 to time t2, the driving signal DS has a level of the ground voltage GND by the second NMOS transistor NT2. From time t2 to time t3, the driving signal DS has a waveform similar to that of the power supply voltage VDD by the first PMOS transistor PT1.

At time t4 which corresponds to a starting point of the power-off duration, the level of the power supply voltage VDD is higher than the sum of the threshold voltages of the plurality of first control transistors NTA1~NTAN. Thus, during the power-off duration, the hysteresis control transistor NTA is turned on, and the driving signal DS is generated based on the first PMOS transistor PT1, the second NMOS transistor NT2 and the hysteresis control transistor NTA. During the power-off duration, since the hysteresis control transistor NTA is turned on, the driving signal DS is generated by detecting a second level VL2 of the power supply voltage VDD that is different from the first level VL1 of the power supply voltage VDD, and then the driving signal DS is transitioned at time t5 at which the power supply voltage VDD has or reaches the second level VL2. For example, from time t4 to time t5, the driving signal DS has a waveform similar to that of the power supply voltage VDD by the first PMOS transistor PT1. From time t5 to time t6, the driving signal DS has the level of the ground voltage GND by the second NMOS transistor NT2 and the hysteresis control transistor NTA.

In an example embodiment, the first level VL1 of the power supply voltage VDD may be determined based on sizes (e.g., channel lengths, channel widths, etc.) of the first PMOS transistor PT1 and the second NMOS transistor NT2. The second level VL2 of the power supply voltage VDD may be determined based on sizes of the first PMOS transistor PT1, the second NMOS transistor NT2 and the hysteresis control transistor NTA.

The reset signal RST generated based on the driving signal DS is activated during the power-on duration and the power-off duration. For example, the reset signal RST is activated from time t1 to time t2 and from time t5 to time t6 during which the driving signal DS has the level of the ground voltage GND.

In an example embodiment, as illustrated in FIG. 3, the reset signal RST may be activated during a part of the power-on duration and a part of the power-off duration. For example, the reset signal RST may be activated during the early part (e.g., from time t1 to time t2) of the power-on duration and the latter part (e.g., from time t5 to time t6) of the power-off duration. For example, the reset signal RST may be activated from the starting point (e.g., time t1) of the power-on duration to a first point (e.g., time t2) of the power-on duration and from a second point (e.g., time t5) of the power-off duration to an ending point (e.g., time t6) of the power-off duration. The first point may represent a timing point at which the power supply voltage VDD reaches the first level VL1 during the power-on duration, and the second point may represent a timing point at which the power supply voltage VDD reaches the second level VL2 during the power-off duration.

In an example embodiment, a time interval from time t3 to time t4 may correspond to a normal operation duration during which a semiconductor integrated circuit including the power on/off reset circuit 100a normally operates or operates in a normal mode.

FIGS. 4, 5, 6 and 7 are circuit diagrams illustrating examples of the power on/off reset circuit of FIG. 1.

Figure 4:
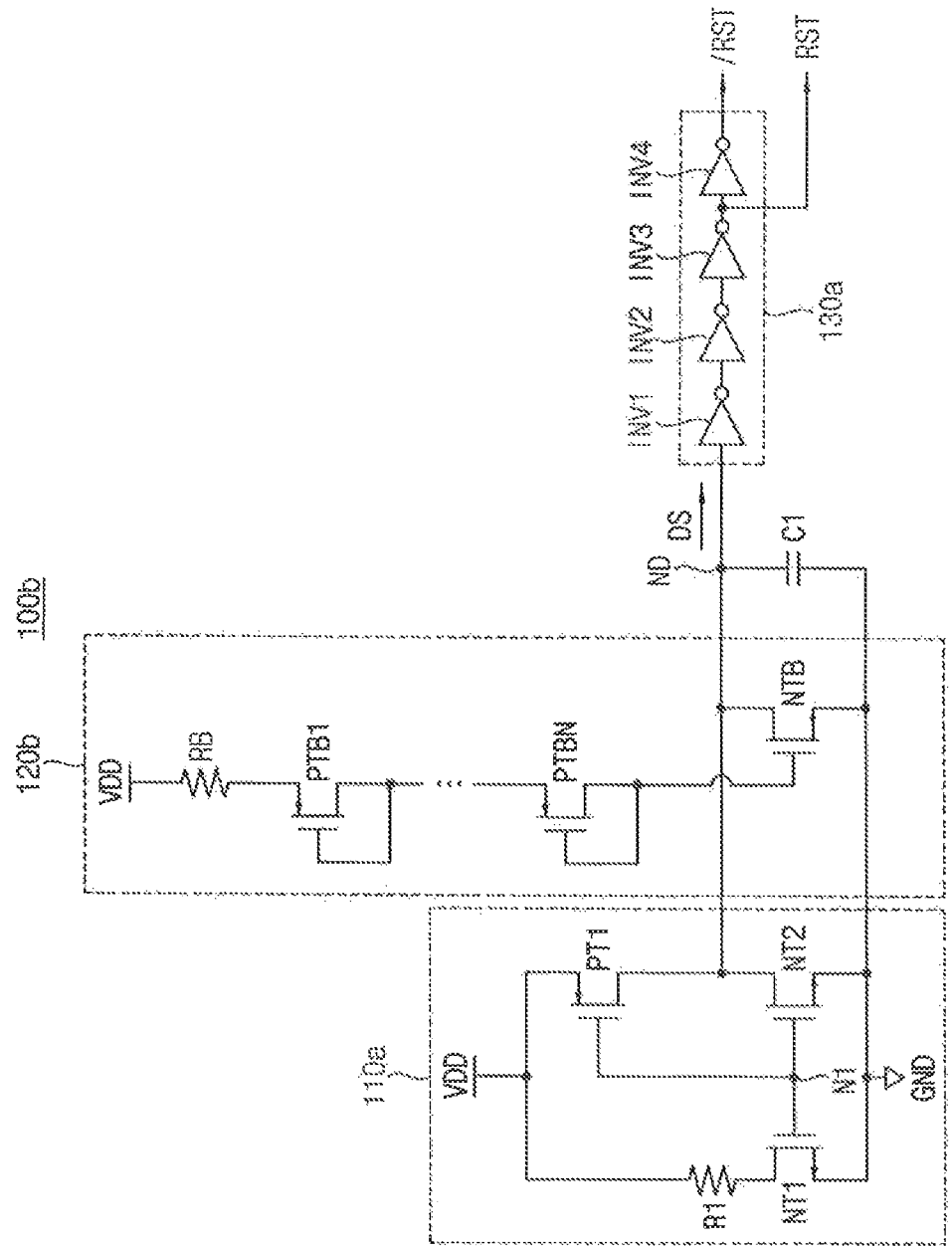
FIGS. 4, 5, 6 and 7 are circuit diagrams illustrating examples of the power on/off reset circuit of FIG. 1.

Referring to FIG. 4, a power on/off reset circuit 100b includes a driving circuit 110a, a hysteresis control circuit 120b and a buffering circuit 130a. The power on/off reset circuit 100b may further include a capacitor C1.

The power on/off reset circuit 100b of FIG. 4 may be substantially the same as the power on/off reset circuit 100a of FIG. 2, except that the hysteresis control circuit 120b in FIG. 4 is different from the hysteresis control circuit 120a in FIG. 2. The driving circuit 110a, the buffering circuit 130a and the capacitor C1 in FIG. 4 may be substantially the same as the driving circuit 110a, the buffering circuit 130a and the capacitor C1 in FIG. 2, respectively.

The hysteresis control circuit 120b may include a hysteresis control transistor NTB and a plurality of first control transistors PTB1, . . . , PTBN. The hysteresis control circuit 120b may further include a resistor RB.

The hysteresis control transistor NTB and the resistor RB in FIG. 4 may be substantially the same as the hysteresis control transistor NTA and the resistor RA in FIG. 2, respectively. The plurality of first control transistors PTB1~PTBN may be connected in series between the power supply voltage VDD and a gate electrode of the hysteresis control transistor NTB. Each of the plurality of first control transistors PTB1~PTBN may include a gate electrode and a drain electrode that are directly connected to each other. For example, each of the plurality of first control transistors PTB1~PTBN may have a diode-connection configuration, and may operate as a diode.

In an example of FIG. 4, the hysteresis control transistor NTB may be an NMOS transistor, and each of the plurality of first control transistors PTB1~PTBN may be a PMOS transistor. Even if types of the plurality of first control transistors PTB1~PTBN in FIG. 4 are different from types of the plurality of first control transistors NTA1~NTAN in FIG. 2, an operation of the power on/off reset circuit 100b of FIG. 4 may be substantially the same as an operation of the power on/off reset circuit 100a of FIG. 2 because a type of the hysteresis control transistor NTB in FIG. 4 is the same as a type of the hysteresis control transistor NTA in FIG. 2.

Figure 5:
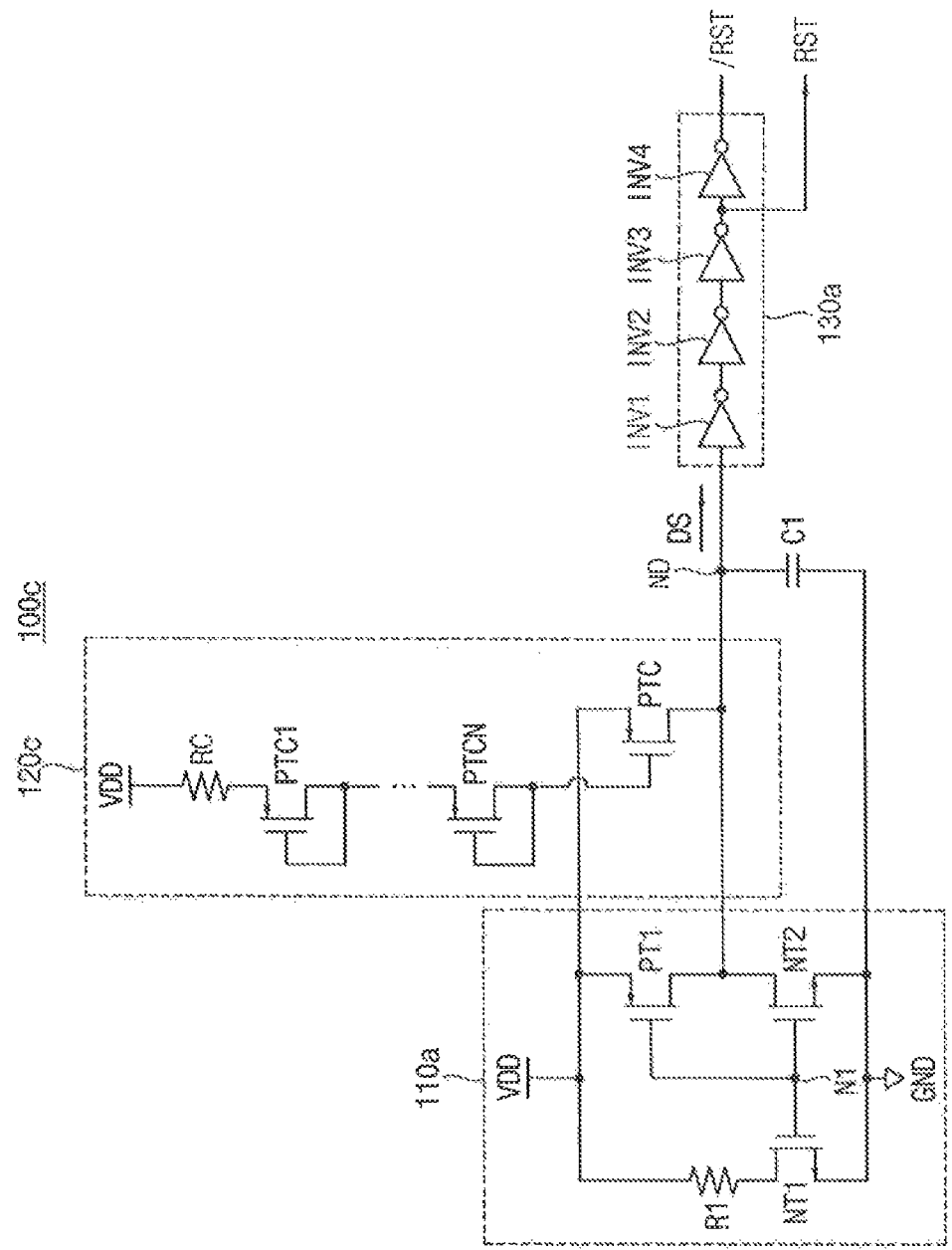

Referring to FIG. 5, a power on/off reset circuit 100c includes a driving circuit 110a, a hysteresis control circuit 120c and a buffering circuit 130a. The power on/off reset circuit 100c may further include a capacitor C1.

The power on/off reset circuit 100c of FIG. 5 may be substantially the same as the power on/off reset circuit 100a of FIG. 2, except that the hysteresis control circuit 120c in FIG. 5 is different from the hysteresis control circuit 120a in FIG. 2.

The hysteresis control circuit 120c may include a hysteresis control transistor PTC and a plurality of first control transistors PTC1, . . . , PTCN. The hysteresis control circuit 120c may further include a resistor RC.

The hysteresis control transistor PTC may be connected between the power supply voltage VDD (e.g., the power terminal) and the output terminal ND of the driving circuit 110a. The plurality of first control transistors PTC1~PTCN may be connected in series between the power supply voltage VDD and a gate electrode of the hysteresis control transistor PTC. Each of the plurality of first control transistors PTC1~PTCN may include a gate electrode and a drain electrode that are directly connected to each other. For example, each of the plurality of first control transistors PTC1~PTCN may have a diode-connection configuration, and may operate as a diode. The resistor RC may be connected between the power supply voltage VDD and the first control transistor PTC1.

In an example of FIG. 5, the hysteresis control transistor PTC may be a PMOS transistor. For example, the hysteresis control transistor PTC may include a first electrode (e.g., a source electrode) connected to the power terminal, a second electrode (e.g., a drain electrode) connected to the output terminal ND of the driving circuit 110a, and the gate electrode. The hysteresis control transistor PTC and the first PMOS transistor PT1 may be connected in parallel between the power terminal and the output terminal ND of the driving circuit 110a. The hysteresis control transistor PTC may help or assist an operation of the first PMOS transistor PT1. For example, the hysteresis control transistor PTC may operate as an auxiliary transistor for the first PMOS transistor PT1.

In addition, in an example of FIG. 5, each of the plurality of first control transistors PTC1~PTCN may be a PMOS transistor. The hysteresis control transistor PTC may be turned on or off based on (e.g., by comparing) the level of the power supply voltage VDD and a sum of threshold voltages of the plurality of first control transistors PTC1~PTCN.

In an example embodiment, if the hysteresis control transistor PTC is a PMOS transistor, the first level of the power supply voltage VDD detected during the power-on duration may be higher than the second level of the power supply voltage VDD detected during the power-off duration. An operation of turning on or off the hysteresis control transistor PTC in FIG. 5 may be opposite to an operation of turning on or off the hysteresis control transistor NTA in FIG. 2.

Figure 6:
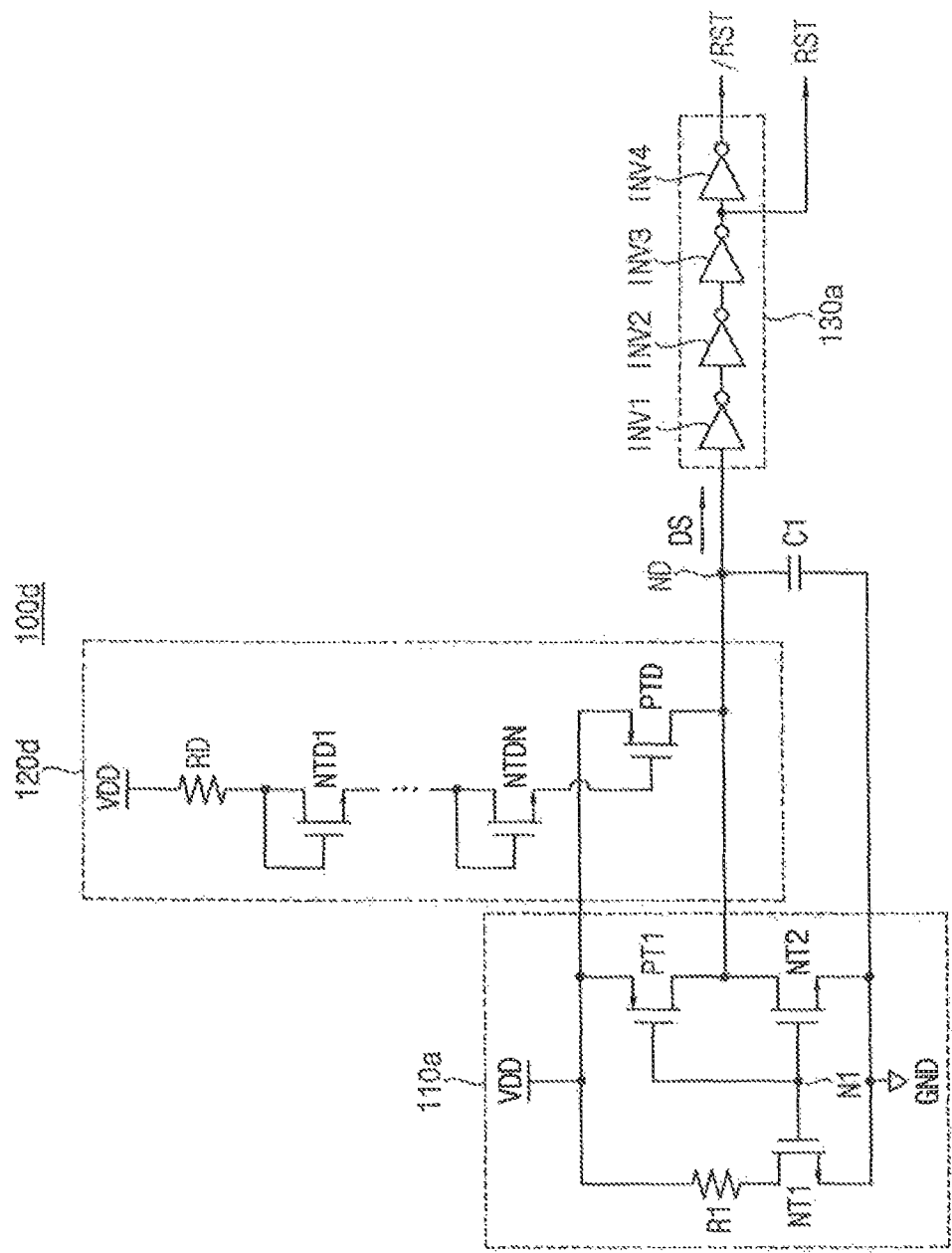

Referring to FIG. 6, a power on/off reset circuit 100d includes a driving circuit 110a, a hysteresis control circuit 120d and a buffering circuit 130a. The power on/off reset circuit 100d may further include a capacitor C1.

The power on/off reset circuit 100d of FIG. 6 may be substantially the same as the power on/off reset circuit 100c of FIG. 5, except that the hysteresis control circuit 120d in FIG. 6 is different from the hysteresis control circuit 120c in FIG. 5.

The hysteresis control circuit 120d may include a hysteresis control transistor PTD and a plurality of first control transistors NTD1, ..., NTDN. The hysteresis control circuit 120d may further include a resistor RD.

The hysteresis control transistor PTD and the resistor RD in FIG. 6 may be substantially the same as the hysteresis control transistor PTC and the resistor RC in FIG. 5, respectively. The plurality of first control transistors NTD1~NTDN may be connected in series between the power supply voltage VDD and a gate electrode of the hysteresis control transistor PTD. Each of the plurality of first control transistors NTD1~NTDN may include a gate electrode and a drain electrode that are directly connected to each other. For example, each of the plurality of first control transistors NTD1~NTDN may have a diode-connection configuration, and may operate as a diode.

In an example of FIG. 6, the hysteresis control transistor PTD may be a PMOS transistor, and each of the plurality of first control transistors NTD1~NTDN may be an NMOS transistor. Even if types of the plurality of first control transistors NTD1~NTDN in FIG. 6 are different from types of the plurality of first control transistors PTC1~PTCN in FIG. 5, an operation of the power on/off reset circuit 100d of FIG. 6 may be substantially the same as an operation of the power on/off reset circuit 100c of FIG. 5 because a type of the hysteresis control transistor PTD in FIG. 6 is the same as a type of the hysteresis control transistor PTC in FIG. 5.

Figure 7:
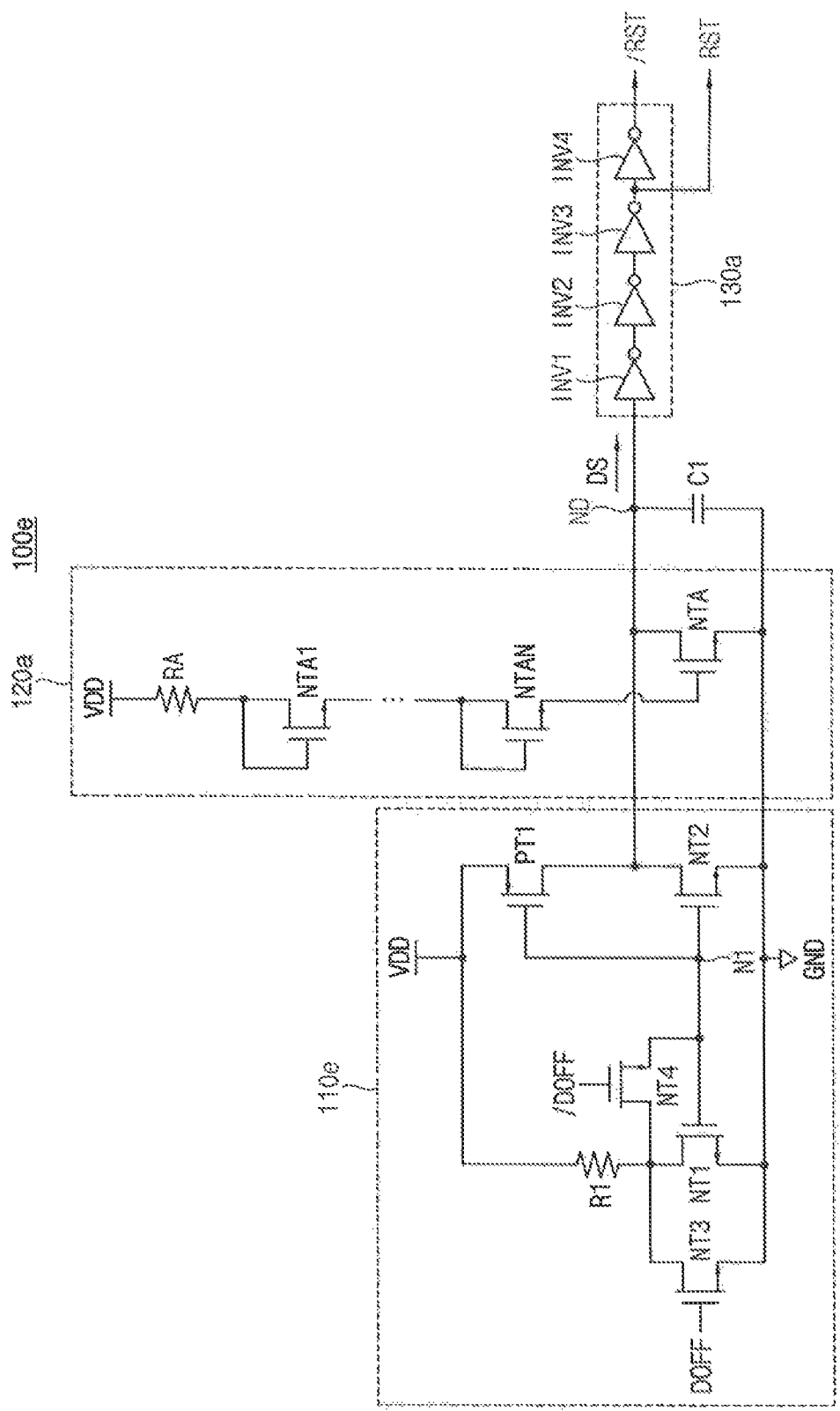

Referring to FIG. 7, a power on/off reset circuit 100e includes a driving circuit 110e, a hysteresis control circuit 120a and a buffering circuit 130a. The power on/off reset circuit 100e may further include a capacitor C1.

The power on/off reset circuit 100e of FIG. 7 may be substantially the same as the power on/off reset circuit 100a of FIG. 2, except that the driving circuit 110e in FIG. 7 is different from the driving circuit 110a in FIG. 2.

The driving circuit 110e may include a first resistor R1, a first NMOS transistor NT1, a first PMOS transistor PT1, a second NMOS transistor NT2, a third NMOS transistor NT3 and a fourth NMOS transistor NT4.

The first resistor R1, the first NMOS transistor NT1, the first PMOS transistor PT1 and the second NMOS transistor NT2 in FIG. 7 may be substantially the same as the first resistor R1, the first NMOS transistor NT1, the first PMOS transistor PT1 and the second NMOS transistor NT2 in FIG. 2, respectively. The third NMOS transistor NT3 may include a gate electrode receiving a driving off signal DOFF. The first NMOS transistor NT1 and the third NMOS transistor NT3 may be connected in parallel between the first resistor R1 and the ground voltage GND. The fourth NMOS transistor NT4 may be connected between the first resistor R1 and the first node N1, and may include a gate electrode receiving an inverted driving off signal /DOFF (or an inversion signal of the driving off signal DOFF).

The driving circuit 110e may be deactivated by the third NMOS transistor NT3 and the fourth NMOS transistor NT4. For example, when the driving off signal DOFF is activated, e.g., in a test mode, the driving circuit 110e may be deactivated, and thus a leakage current may be reduced.

In an example embodiment, the hysteresis control circuit 120a included in the power on/off reset circuit 100e of FIG. 7 may be replaced with one of the hysteresis control circuit 120b in FIG. 4, the hysteresis control circuit 120c in FIG. 5 and the hysteresis control circuit 120d in FIG. 6. In an example embodiment, a configuration of the driving circuit 110e may be changed.

Figure 8:
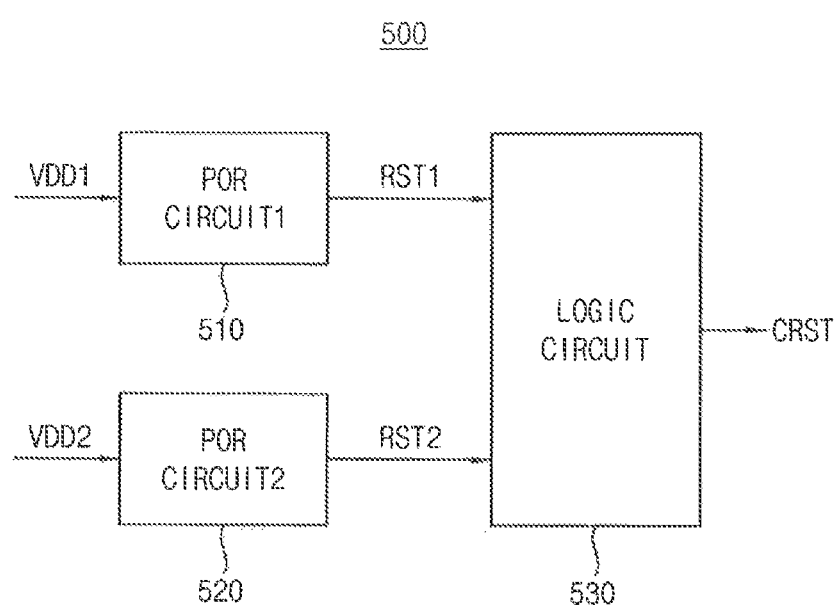
FIG. 8 is a block diagram illustrating a reset signal generating circuit according to an example embodiment.

FIG. 8 is a block diagram illustrating a reset signal generating circuit according to an example embodiment.

Generally, a semiconductor integrated circuit may operate based on two or more different power supply voltages, and thus two or more power on/off reset circuits may be required. Each of the two or more power on/off reset circuits corresponds to one of the two or more different power supply voltages. As used herein, the reset signal generating circuit may indicate a circuit that includes two or more power on/off reset circuits and generates a combined reset signal by combining two or more reset signals generated from the two or more power on/off reset circuits.

Referring to FIG. 8, a reset signal generating (RST GEN) circuit 500 includes a first power on/off reset circuit 510, a second power on/off reset circuit 520 and a logic circuit 530.

The first power on/off reset circuit 510 generates a first reset signal RST1 that is activated during a first power-on duration of a first power supply voltage VDD1 and a first power-off duration of the first power supply voltage VDD1.

The second power on/off reset circuit 520 generates a second reset signal RST2 that is activated during a second power-on duration of a second power supply voltage VDD2 and during a second power-off duration of the second power supply voltage VDD2. The second power supply voltage VDD2 is different from the first power supply voltage VDD1.

The logic circuit 530 generates a combined reset signal CRST based on the first reset signal RST1 and the second reset signal RST2. For example, the combined reset signal CRST may be activated during the first power-on duration, the second power-on duration, the first power-off duration and the second power-off duration.

At least one of the first power on/off reset circuit 510 and the second power on/off reset circuit 520 may correspond to the power on/off reset circuit 100 according to an example embodiment. Hereinafter, the reset signal generating circuit 500 will be described based on an example where the first power on/off reset circuit 510 corresponds to the power on/off reset circuit 100 according to an example embodiment and the second power on/off reset circuit 520 corresponds to a conventional power on/off reset circuit.

The first power on/off reset circuit 510 may detect different levels of the first power supply voltage VDD1 during the first power-on duration and the first power-off duration of the first power supply voltage VDD1. The second power on/off reset circuit 520 may detect the same level of the second power supply voltage VDD2 during the second power-on duration and the second power-off duration of the second power supply voltage VDD2.

For example, as illustrated in FIG. 1, the first power on/off reset circuit 510 includes a first driving circuit, a first hysteresis control circuit and a first buffering circuit. The first driving circuit detects a first level of the first power supply voltage VDD1 during the first power-on duration, and detects a second level of the first power supply voltage VDD1 during the first power-off duration. The second level is different from the first level. The first driving circuit generates a first driving signal that is transitioned based on the first level and the second level. The first hysteresis control circuit is connected to an output terminal of the first driving circuit. The first hysteresis control circuit is activated or deactivated based on the first power supply voltage VDD1 without a control signal provided from an external circuit. The first hysteresis control circuit is activated during one of the first power-on duration and the first power-off duration, and is deactivated during the other of the first power-on duration and the first power-off duration such that the second level is different from the first level based on the activation and the deactivation of the first hysteresis control circuit.

The first buffering circuit is connected to the output terminal of the first driving circuit. The first buffering circuit generates the first reset signal RST based on the first driving signal.

The second power on/off reset circuit 520 may include a second driving circuit and a second buffering circuit. The second driving circuit may detect a third level of the second power supply voltage VDD2 during the second power-on duration and the second power-off duration. The second driving circuit may generate a second driving signal that is transitioned based on the third level. The second buffering circuit may be connected to an output terminal of the second driving circuit. The second buffering circuit may generate the second reset signal RST2 based on the second driving signal.

Figure 9:
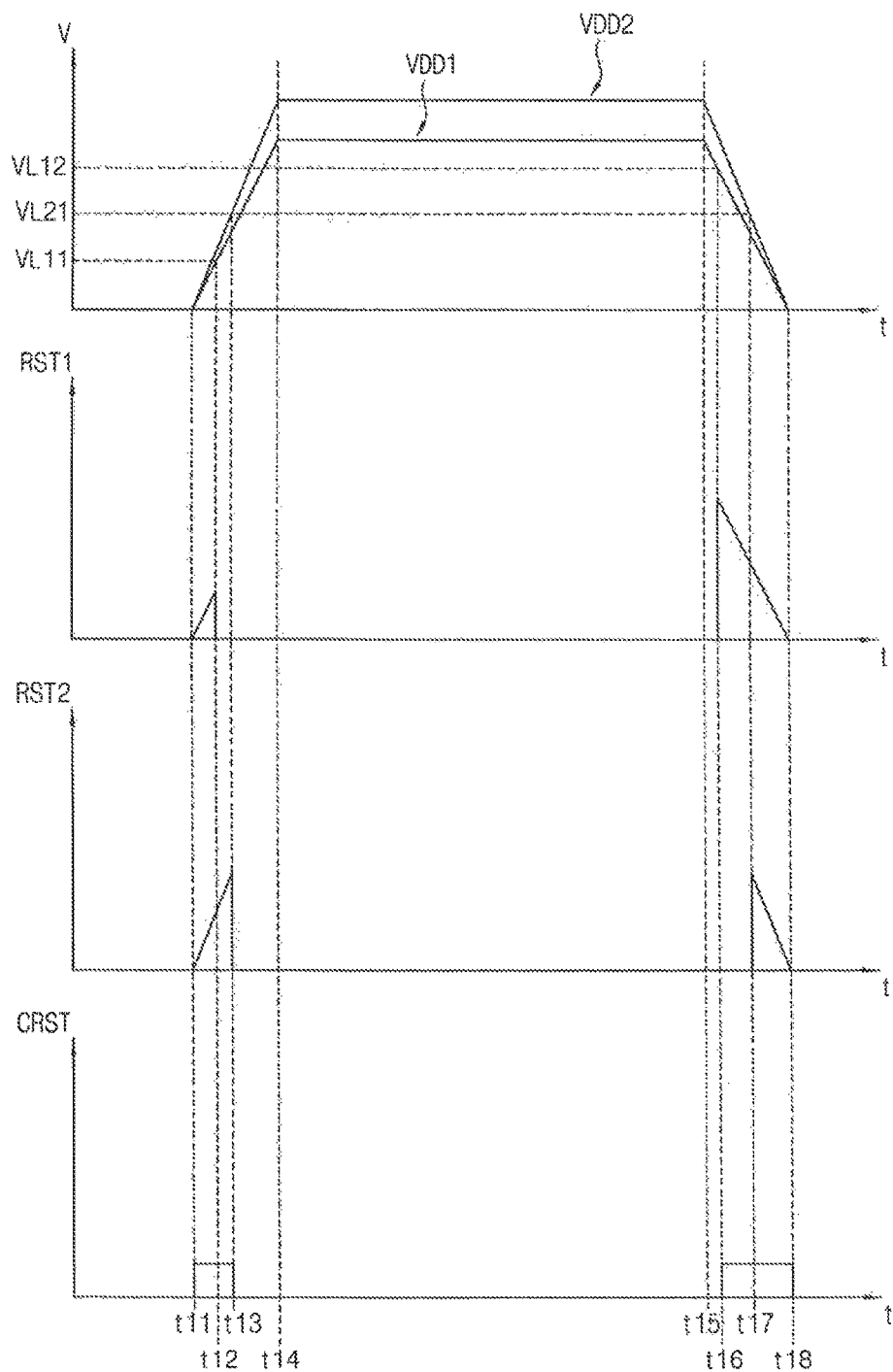
FIG. 9 is a diagram describing an operation of the reset signal generating circuit of FIG. 8.

FIG. 9 is a diagram describing an operation of the reset signal generating circuit of FIG. 8.

Referring to FIGS. 8 and 9, a time interval from time t11 to time t14 may correspond to the first power-on duration of the first power supply voltage VDD1 and the second power-on duration of the second power supply voltage VDD2, and a time interval from time t15 to time t18 may correspond to the first power-off duration of the first power supply voltage VDD1 and the second power-off duration of the second power supply voltage VDD2. An activation level of the first power supply voltage VDD1 may be different from an activation level of the second power supply voltage VDD2.

An operation of the first power on/off reset circuit 510 may be substantially the same as an operation described with reference to FIGS. 2 and 3. For example, the first power on/off reset circuit 510 detects a first level VL11 of the first power supply voltage VDD1 during the first power-on duration, and detects a second level VL12 of the first power supply voltage VDD1 during the first power-off duration. The first reset signal RST1 is activated from a starting point (e.g., time t11) of the first power-on duration to a first point (e.g., time t12) of the first power-on duration and from a second point (e.g., time t16) of the first power-off duration to an ending point (e.g., time t18) of the first power-off duration. The first point may represent a timing point at which the first power supply voltage VDD1 reaches the first level VL11 during the first power-on duration, and the second point may represent a timing point at which the first power supply voltage VDD1 reaches the second level VL12 during the first power-off duration. Based on the first hysteresis control circuit having the hysteresis characteristic, the first power on/off reset circuit 510 may efficiently detect the different levels of the first power supply voltage VDD during the first power-on duration and the first power-off duration.

An operation of the second power on/off reset circuit 520 may be similar to that of the first power on/off reset circuit 510, except that the second power on/off reset circuit 520 detects a single level of the second power supply voltage VDD2. For example, the second power on/off reset circuit 520 detects a third level VL21 of the second power supply voltage VDD2 during the second power-on duration and the second power-off duration. The second reset signal RST2 is activated from a starting point (e.g., time t11) of the second power-on duration to a third point (e.g., time t13) of the second power-on duration and from a fourth point (e.g., time t17) of the second power-off duration to an ending point (e.g., time t18) of the second power-off duration. The third point may represent a timing point at which the second power supply voltage VDD2 reaches the third level VL21 during the second power-on duration, and the fourth point may represent a timing point at which the second power supply voltage VDD2 reaches the third level VL21 during the second power-off duration.

The logic circuit 530 generates the combined reset signal CRST by performing a logic operation on the first reset signal RST1 and the second reset signal RST2. The combined reset signal CRST is activated while at least one of the first reset signal RST1 and the second reset signal RST2 is activated. For example, the combined reset signal CRST is activated from time t11 to time t13 and from time t16 to time t18.

In an example embodiment, as illustrated in FIG. 9, the second level VL12 may be higher than the first level VL11, and the third level VL21 may be higher than the first level VL11 and may be lower than the second level VL12. In an example embodiment, although not illustrated in FIG. 9, the first level VL11, the second level VL12 and the third level VL21 may be changed.

Although FIG. 9 illustrates an example where the first power-on duration and the first power-off duration are the same as the second power-on duration and the second power-off duration, respectively. In addition, the first power-on duration may be different from the second power-on duration, and/or the first power-off duration may be different from the second power-off duration.

Figure 10:
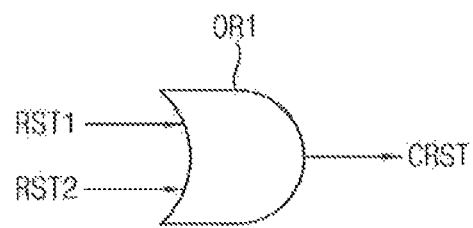
FIG. 10 is a block diagram illustrating an example of a logic circuit included in the reset signal generating circuit of FIG. 8.

FIG. 10 is a block diagram illustrating an example of a logic circuit included in the reset signal generating circuit of FIG. 8.

Referring to FIG. 10, a logic circuit 530a may include an OR gate OR1.

The OR gate OR1 may perform an OR operation on the first reset signal RST1 and the second reset signal RST2 to generate the combined reset signal CRST. Thus, as described with reference to FIG. 9, the combined reset signal CRST may be activated while at least one of the first reset signal RST1 and the second reset signal RST2 is activated.

Figure 11:
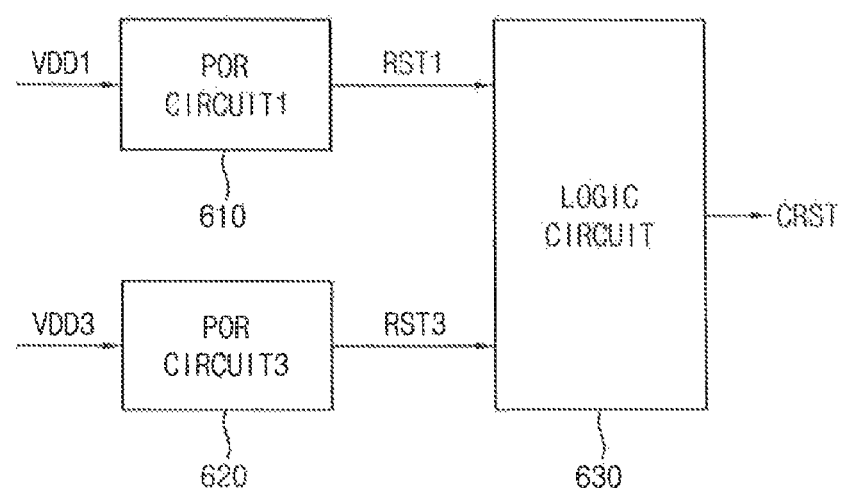
FIG. 11 is a block diagram illustrating a reset signal generating circuit according to an example embodiment.

FIG. 11 is a block diagram illustrating a reset signal generating circuit according to an example embodiment.

Referring to FIG. 11, a reset signal generating circuit 600 includes a first power on/off reset circuit 610, a third power on/off reset circuit 620 and a logic circuit 630.

As with an example of FIG. 8, at least one of the first power on/off reset circuit 610 and the third power on/off reset circuit 620 in FIG. 11 may correspond to the power on/off reset circuit 100 (e.g., in FIG. 1) according to an example embodiment. Hereinafter, the reset signal generating circuit 600 will be described based on an example where both the first power on/off reset circuit 610 and the third power on/off reset circuit 620 correspond to the power on/off reset circuit 100 according to an example embodiment.

The first power on/off reset circuit 610 and the logic circuit 630 in FIG. 11 may be substantially the same as the first power on/off reset circuit 510 and the logic circuit 530 in FIG. 8, respectively. The first power on/off reset circuit 610 generates the first reset signal RST1 that is activated during the first power-on duration of the first power supply voltage VDD1 and the first power-off duration of the first power supply voltage VDD1. The logic circuit 630 generates the combined reset signal CRST based on the first reset signal RST1 and a third reset signal RST3.

The third power on/off reset circuit 620 generates the third reset signal RST3 that is activated during a third power-on duration of a third power supply voltage VDD3 and a third power-off duration of the third power supply voltage VDD3. The third power supply voltage VDD3 is different from the first power supply voltage VDD1.

The third power on/off reset circuit 620 may detect different levels of the third power supply voltage VDD3 during the third power-on duration and the third power-off duration of the third power supply voltage VDD3. For example, the third power on/off reset circuit 620 may include a third driving circuit, a third hysteresis control circuit and a third buffering circuit. The third driving circuit may detect a third level of the third power supply voltage VDD3 during the third power-on duration, and may detect a fourth level of the third power supply voltage VDD3 during the third power-off duration. The fourth level may be different from the third level. The third driving circuit may generate a third driving signal that is transitioned based on the third level and the fourth level. The third hysteresis control circuit may be connected to an output terminal of the third driving circuit. The third hysteresis control circuit may be activated or deactivated based on the third power supply voltage VDD3 without a control signal provided from an external circuit. The third hysteresis control circuit may be activated during one of the third power-on duration and the third power-off duration, and may be deactivated during the other of the third power-on duration and the third power-off duration such that the fourth level is different from the third level based on the activation and the deactivation of the third hysteresis control circuit. The third buffering circuit may be connected to the output terminal of the third driving circuit. The third buffering circuit may generate the third reset signal RST3 based on the first driving signal.

Figure 12:
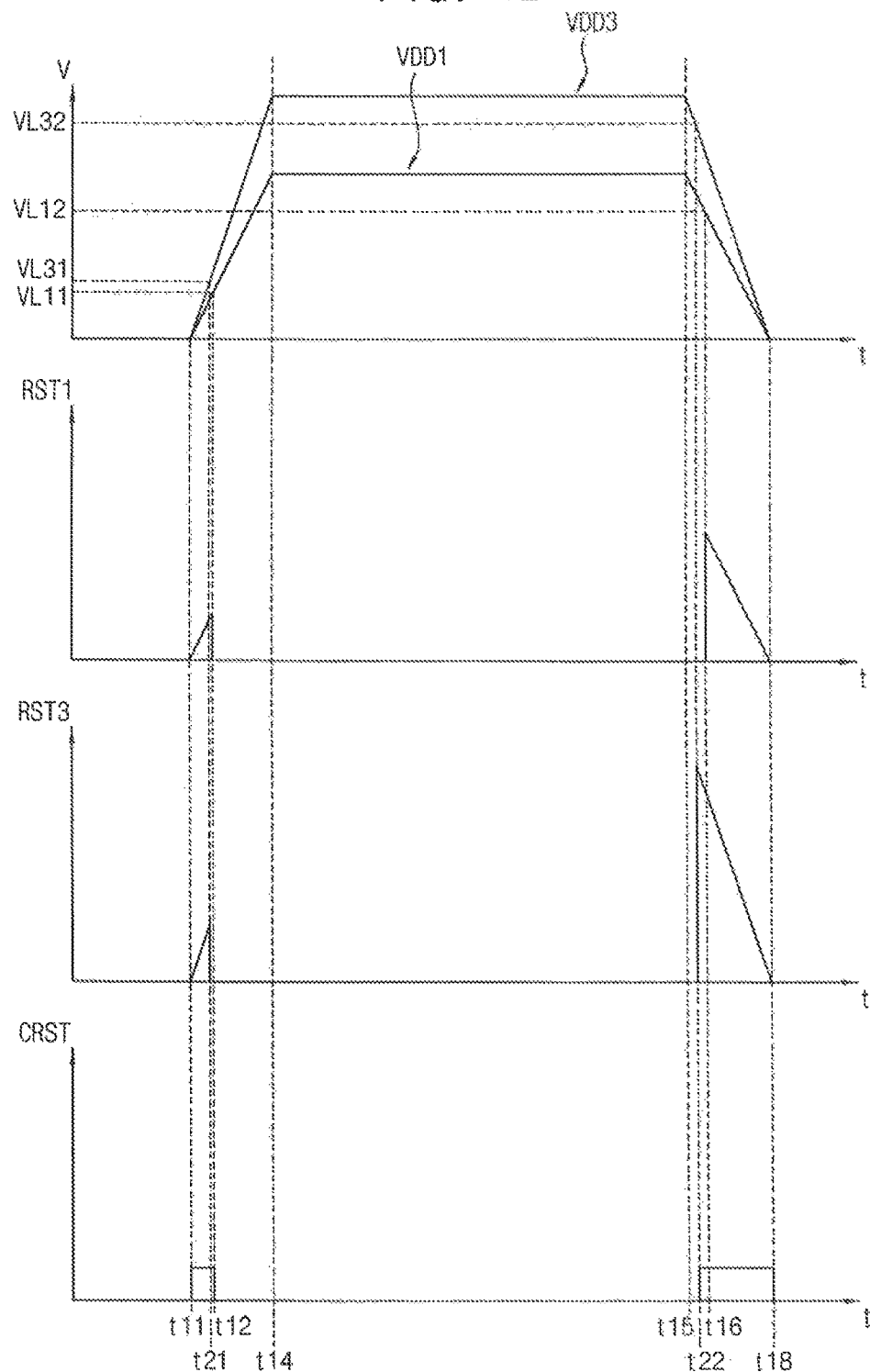
FIG. 12 is a diagram describing an operation of the reset signal generating circuit of FIG. 11.

FIG. 12 is a diagram describing an operation of the reset signal generating circuit of FIG. 11.

Referring to FIGS. 11 and 12, a time interval from time t11 to time t14 may correspond to the first power-on duration of the first power supply voltage VDD1 and the third power-on duration of the third power supply voltage VDD3, and a time interval from time t15 to time t18 may correspond to the first power-off duration of the first power supply voltage VDD1 and the third power-off duration of the third power supply voltage VDD3. An activation level of the first power supply voltage VDD1 may be different from an activation level of the third power supply voltage VDD3.

An operation of the first power on/off reset circuit 610 may be substantially the same as that of the first power on/off reset circuit 510 in FIG. 8 described with reference to FIG. 9.

An operation of the third power on/off reset circuit 620 may be similar to that of the first power on/off reset circuit 610. For example, the third power on/off reset circuit 620 detects a third level VL31 of the third power supply voltage VDD3 during the third power-on duration, and detects a fourth level VL32 of the third power supply voltage VDD3 during the third power-off duration. The third reset signal RST3 is activated from a starting point (e.g., time t11) of the third power-on duration to a third point (e.g., time t21) of the third power-on duration and from a fourth point (e.g., time t22) of the third power-off duration to an ending point (e.g., time t18) of the third power-off duration. The third point may represent a timing point at which the third power supply voltage VDD3 reaches the third level VL31 during the third power-on duration, and the fourth point may represent a timing point at which the third power supply voltage VDD3 reaches the fourth level VL32 during the third power-off duration. Based on the third hysteresis control circuit having the hysteresis characteristic, the third power on/off reset circuit 620 may efficiently detect the different levels of the third power supply voltage VDD3 during the third power-on duration and the third power-off duration.

The logic circuit 630 generates the combined reset signal CRST by performing a logic operation on the first reset signal RST1 and the third reset signal RST3. The combined reset signal CRST is activated while at least one of the first reset signal RST1 and the third reset signal RST3 is activated. For example, the combined reset signal CRST is activated from time t11 to time t12 and from time t22 to time t18.

In an example embodiment, as illustrated in FIG. 11, the second level VL12 may be higher than the first level VL11, and the fourth level VL32 may be higher than the third level VL31. When the activation level of the third power supply voltage VDD3 is higher than the activation level of the first power supply voltage VDD1, the third level VL31 may be higher than the first level VL11, and the fourth level VL32 may be higher than the second level VL12. In an example embodiment, the first level VL11, the second level VL12, the third level VL31 and the fourth level VL32 may be changed.

Although FIGS. 8 through 12 illustrate examples where the reset signal generating circuit includes two power on/off reset circuits, the reset signal generating circuit may include any number of (e.g., three or more) power on/off reset circuits.

Figure 13:
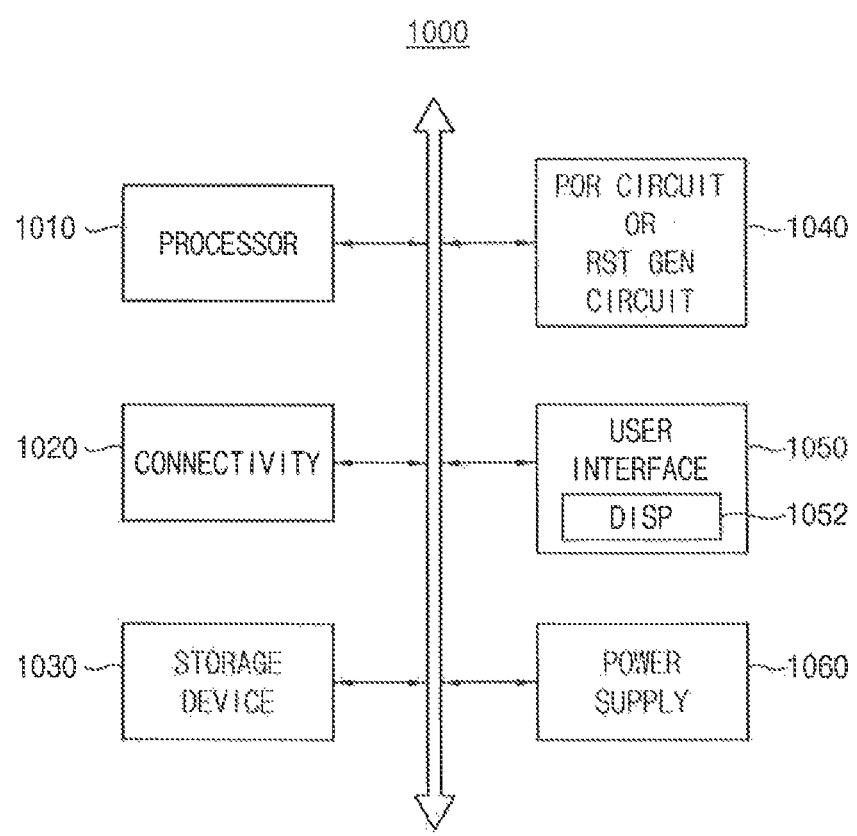
FIG. 13 is a block diagram illustrating an electronic system according to an example embodiment.

FIG. 13 is a block diagram illustrating an electronic system according to an example embodiment.

Referring to FIG. 13, an electronic system 1000 may include a processor 1010, a connectivity module 1020, a storage device 1030, a power on/off reset (POR) circuit or a reset signal generating (RST GEN) circuit 1040, a user interface 1050 and a power supply 1060.

The processor 1010 may control overall operations of the electronic system 1000. The connectivity module 1020 may communicate with an external device. The storage device 1030 may operate as a data storage for data processed by the processor 1010 or a working memory in the electronic system 1000. The user interface 1050 may include at least one input device such as a keypad, a button, a microphone, a touch screen, etc., and/or at least one output device such as a speaker, a display device (DISP) 1052, etc. The power supply 1060 may provide power to the electronic system 1000.

The power on/off reset circuit or the reset signal generating circuit 1040 may be the power on/off reset circuit 100 or the reset signal generating circuit 500 or 600 according to an example embodiment. The power on/off reset circuit may include the hysteresis control circuit having the hysteresis characteristic, and thus, may detect the different levels of the power supply voltage during the power-on duration and the power-off duration. Accordingly, the power on/off reset circuit may have relatively simple structure and increased performance.

Although FIG. 13 illustrates an example where the electronic system 1000 includes a single power on/off reset circuit or a single reset signal generating circuit, the electronic system 1000 may include two or more power on/off reset circuits or two or more reset signal generating circuits, or each element included in the electronic system 1000 may include one or more power on/off reset circuits or one or more reset signal generating circuits.

The present inventive concept may be applied to various devices and systems that include the power on/off reset circuit and/or the reset signal generating circuit. For example, the present inventive concept may be applied to systems such as a mobile phone, a smart phone, a tablet computer, a laptop computer, a personal digital assistants (PDA), a portable multimedia player (PMP), a digital camera, a portable game console, a wearable system, an internet of things (IoT) system, a three-dimensional (3D) geometry reconstruction system, an array camera system, a virtual reality (VR) system, an augmented reality (AR) system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and aspects of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A power on/off reset circuit comprising:
   a driving circuit configured to detect a first level of a power supply voltage during a power-on duration of the power supply voltage, configured to detect a second level of the power supply voltage during a power-off duration of the power supply voltage, and configured to generate a driving signal that is transitioned based on the first level and the second level, the second level of the power supply voltage being different from the first level of the power supply voltage;
   a hysteresis control circuit connected to an output terminal of the driving circuit, and configured to be activated or deactivated based on the power supply voltage; and
   a buffering circuit connected to the output terminal of the driving circuit, and configured to generate a reset signal based on the driving signal,
   wherein the hysteresis control circuit is configured to be activated during one of the power-on duration and the power-off duration, and configured to be deactivated during the other of the power-on duration and the power-off duration, and
   the reset signal is activated during the power-on duration and the power-off duration,
   wherein the hysteresis control circuit includes:
   a hysteresis control transistor connected between the output terminal of the driving circuit and a ground voltage; and
   a plurality of first control transistors connected in series between the power supply voltage and a gate electrode of the hysteresis control transistor, each of the plurality of first control transistors including a gate electrode and a drain electrode that are directly connected to each other.

2. The power on/off reset circuit of claim 1, wherein each of the hysteresis control transistor and the plurality of first control transistors is an n-type metal oxide semiconductor (NMOS) transistor.

3. The power on/off reset circuit of claim 1, wherein the hysteresis control transistor is an NMOS transistor, and each of the plurality of first control transistors is a p-type metal oxide semiconductor (PMOS) transistor.

4. The power on/off reset circuit of claim 1, wherein the driving circuit includes:
   a first resistor connected to the power supply voltage;
   a first NMOS transistor connected between the first resistor and a ground voltage;
   a first PMOS transistor connected to the power supply voltage; and
   a second NMOS transistor connected between the first PMOS transistor and the ground voltage, and
   wherein a gate electrode of the first NMOS transistor, a gate electrode of the first PMOS transistor and a gate electrode of the second N MOS transistor are commonly connected to a first node.

5. The power on/off reset circuit of claim 4, wherein the driving circuit further includes:
   a third NMOS transistor including a gate electrode that receives a driving off signal, the first NMOS transistor and the third NMOS transistor being connected in parallel between the first resistor and the ground voltage; and
   a fourth NMOS transistor connected between the first resistor and the first node, the fourth NMOS transistor including a gate electrode that receives an inverted driving off signal.

6. The power on/off reset circuit of claim 1, wherein the buffering circuit includes a plurality of inverters that are connected in series.

7. The power on/off reset circuit of claim 1, wherein the second level is higher than the first level.

8. The power on/off reset circuit of claim 1, wherein the reset signal is activated from a starting point of the power-on duration to a first point of the power-on duration, the first point representing a timing point at which the power supply voltage reaches the first level during the power-on duration, and
   the reset signal is activated from a second point of the power-off duration to an ending point of the power-off duration, the second point representing a timing point at which the power supply voltage reaches the second level during the power-off duration.

9. A power on/off reset circuit comprising:
   a driving circuit configured to detect different levels of a power supply voltage during a power-on duration and a power-off duration of the power supply voltage, and generate a driving signal based on the different levels of the power supply voltage;
   a hysteresis control circuit connected to the driving circuit, and configured to be activated or deactivated based on the power supply voltage, wherein the hysteresis control circuit includes a hysteresis control transistor and a plurality of first control transistors connected to each other, wherein a gate electrode of the hysteresis control transistor is connected to a source electrode of a first control transistor of the plurality of first control transistors; and
   a buffering circuit configured to generate a reset signal based on the driving signal.

10. The power on/off reset circuit of claim 9, wherein the hysteresis control circuit is configured to be activated during one of the power-on duration and the power-off duration, and configured to be deactivated during the other of the power-on duration and the power-off duration.

11. The power on/off reset circuit of claim 9, wherein the driving circuit is configured to detect a first level of the power supply voltage during the power-on duration of the power supply voltage, and configured to detect a second level of the power supply voltage during the power-off duration of the power supply voltage, the second level of the power supply voltage being different from the first level of the power supply voltage.

12. The power on/off reset circuit of claim 9, wherein each of the plurality of first control transistors includes a gate electrode and a drain electrode that are directly connected to each other.

* * * * *